US007354789B2

(12) United States Patent
Han

(10) Patent No.: US 7,354,789 B2
(45) Date of Patent: Apr. 8, 2008

(54) CMOS IMAGE SENSOR AND METHOD FOR FABRICATING THE SAME

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 156 days.

(21) Appl. No.: 10/982,643

(22) Filed: Nov. 4, 2004

(65) Prior Publication Data

US 2005/0093036 A1 May 5, 2005

(30) Foreign Application Priority Data

Nov. 4, 2003 (KR) .................... 10-2003-0077567
Nov. 4, 2003 (KR) .................... 10-2003-0077568

(51) Int. Cl.
   *H01L 21/00* (2006.01)
(52) U.S. Cl. ................ 438/57; 438/151; 438/199; 257/E25.032; 257/E27.133
(58) Field of Classification Search ............... 438/48, 438/290, 449, 450, 451, 328, 197–199, 510, 438/514, 527, 530, 532, 73, 78, 292, 461, 438/FOR. 187, FOR. 216, 57, 149, 151; 257/290–292, E25.032, E27.133, E21.632, 257/E21.63

See application file for complete search history.

(56) References Cited

U.S. PATENT DOCUMENTS

| | | | | |
|---|---|---|---|---|
| 4,831,430 A | * | 5/1989 | Umeji | .................... 257/463 |
| 4,906,595 A | * | 3/1990 | van der Plas et al. | ...... 438/439 |
| 4,984,047 A | * | 1/1991 | Stevens | .................... 257/223 |
| 5,598,022 A | * | 1/1997 | Kyomasu | .................... 257/458 |
| 5,841,126 A | | 11/1998 | Fossum et al. | |
| 5,859,462 A | * | 1/1999 | Tredwell et al. | ............ 257/443 |
| 5,886,659 A | | 3/1999 | Pain et al. | |
| 5,990,506 A | | 11/1999 | Fossum et al. | |
| 6,005,619 A | | 12/1999 | Fossum | |
| 6,021,172 A | | 2/2000 | Fossum et al. | |
| 6,124,165 A | * | 9/2000 | Lien | .......................... 438/253 |
| 6,133,131 A | * | 10/2000 | Lai | .............................. 438/595 |
| 6,184,055 B1 | * | 2/2001 | Yang et al. | .................... 438/57 |

(Continued)

OTHER PUBLICATIONS

Ghandi, Sorab A. VLSI Fabrication Principles: Silicon and Gallium Arsenide. 1983, Wiley-Interscience Publication. p. 326.*

(Continued)

*Primary Examiner*—Fernando L. Toledo
*Assistant Examiner*—Quovaunda Jefferson
(74) *Attorney, Agent, or Firm*—Andrew D. Fortney

(57) ABSTRACT

CMOS image sensor and method for fabricating the same, the CMOS image sensor including a second conductive type semiconductor substrate having an active region and a device isolation region defined therein, wherein the active region has a photodiode region and a transistor region defined therein, a device isolating film in the semiconductor substrate of the device isolation region, a first conductive type impurity region in the semiconductor substrate of the photodiode region, the first conductive type impurity region being spaced a distance from the device isolation film, and a second conductive type first impurity region in the semiconductor substrate between the first conductive type impurity region and the device isolation film, thereby reducing generation of a darkcurrent at an interface between the photodiode region and a field region.

20 Claims, 12 Drawing Sheets

U.S. PATENT DOCUMENTS

| | | |
|---|---|---|
| 6,462,365 B1 | 10/2002 | He et al. |
| 6,847,051 B2 * | 1/2005 | Hong .......................... 257/59 |
| 6,897,082 B2 * | 5/2005 | Rhodes et al. ............... 438/48 |
| 2001/0015435 A1 * | 8/2001 | Suzuki et al. .................. 257/1 |
| 2002/0175355 A1 * | 11/2002 | Shim .......................... 257/290 |
| 2003/0227064 A1 * | 12/2003 | Maeda ....................... 257/431 |
| 2004/0129990 A1 * | 7/2004 | Lee ............................ 257/428 |

OTHER PUBLICATIONS

Kang, Sung-Mo et al. CMOS Digital Integrated Circuits: Analysis and Design, 2nd Ed. 1999 The Mc-Graw Hill Companies. p. 55.*

* cited by examiner

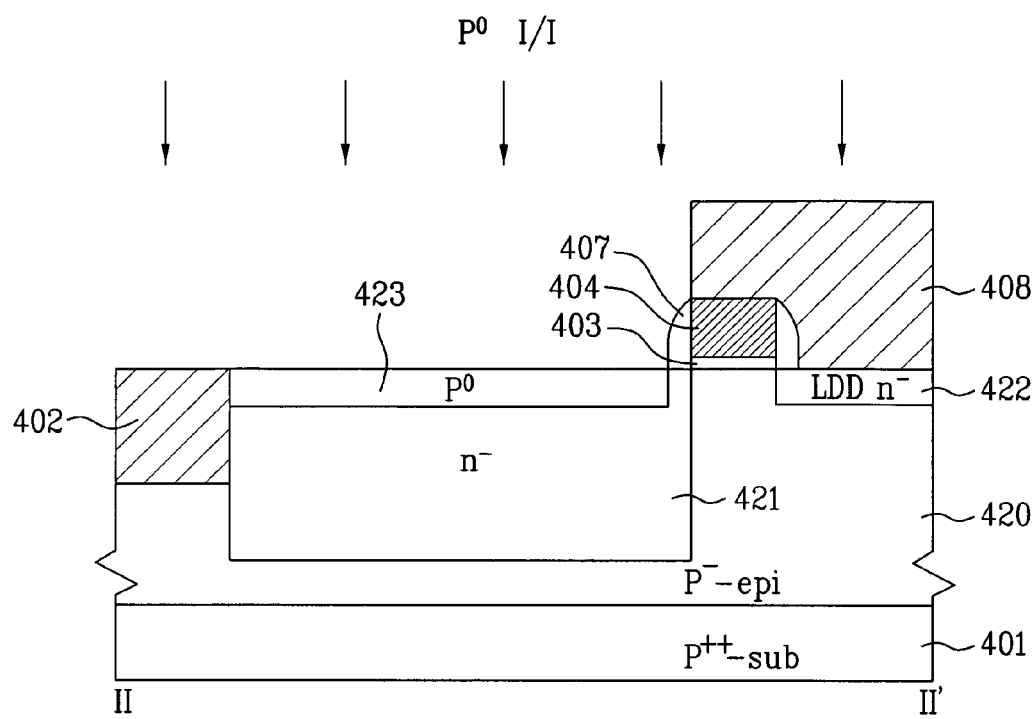
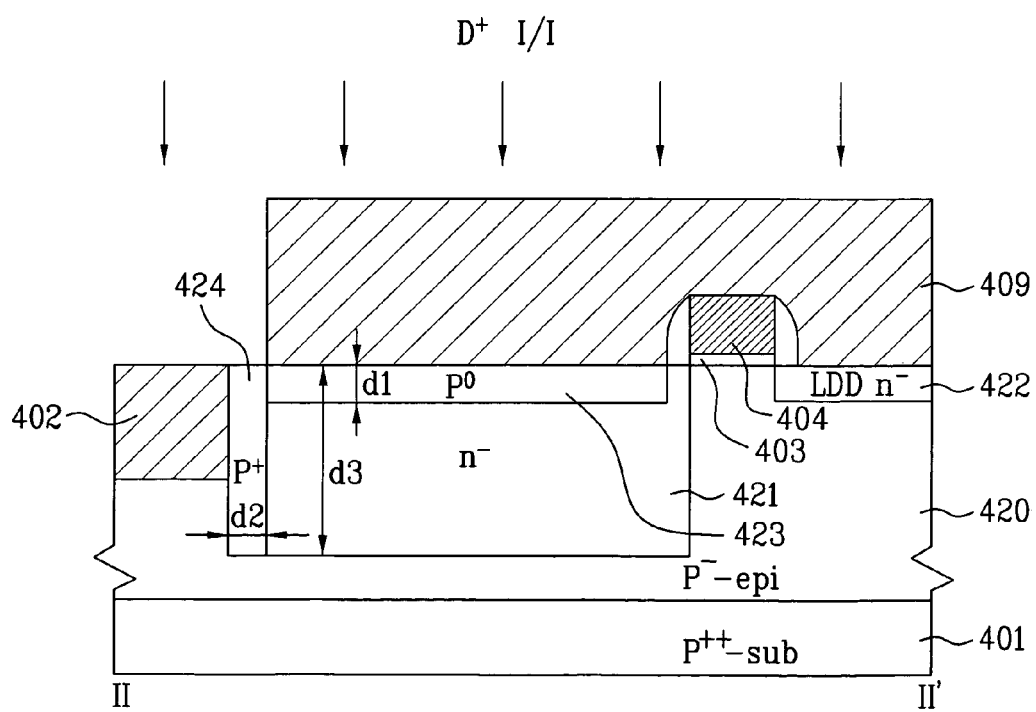

CMOS IMAGE SENSOR AND METHOD FOR FABRICATING THE SAME

This application claims the benefit of the Korean Application Nos. P2003-77567, and P2003-77568, both filed on Nov. 4, 2003, which are hereby incorporated by reference.

BACKGROUND OF THE INVENTION

1. Field of the Invention

The present invention relates to CMOS image sensors, and more particularly, to a method for fabricating a CMOS image sensor which can decrease a darkcurrent generated in an interface of a photodiode region and a field region.

2. Discussion of the Related Art

Generally, an image sensor is a semiconductor device for converting an optical image into an electric signal. In the image sensors, there are charge coupled devices (CCD) and complementary metal oxide semiconductor (CMOS) image sensors.

The charge coupled device (CCD) is provided with a plurality of photodiodes (PD) arranged in a matrix each for converting an optical signal into an electric signal, a plurality of vertical charge coupled devices (VCCD) formed between each vertical photodiode arranged in a matrix for vertical transmission of electric charges generated from each photodiode, a horizontal charge coupled device (HCCD) for horizontal transmission of the electric charges transmitted by each of the vertical charge coupled devices (VCCD), and a sense amplifier (Sense Amp) for sensing and forwarding the horizontally transmitted electric charges.

However, the charge coupled device (CCD) has disadvantages of a complicated driving method, high power consumption, and a complicated fabrication process requiring a multi-phased photo process. In the charge coupled device (CCD), a control circuit, a signal processing circuit, an analog to digital (A/D) converter circuit, and so on cannot be easily integrated into a charge coupled device chip, thereby having the problem of difficulty in forming compact-size products.

Recently, the complementary metal oxide semiconductor (CMOS) image sensor has been considered to be the next generation image sensor that can resolve the problems and disadvantages of the charge coupled device (CCD). The CMOS image sensor is a device adopting a CMOS technology using the control circuit, the signal processing circuit, and so on as a peripheral circuit, so as to form MOS transistors in correspondence with the number of unit pixels on a semiconductor substrate, in order to sequentially detect the electric signals of each unit pixel by using a switching method, thereby representing an image.

Since the CMOS image sensor uses a CMOS fabrication technology, the CMOS image sensor is advantageous in that it has low power consumption and has a simple fabrication method through less photo process steps. In the CMOS image sensor, a control circuit, a signal processing circuit, an A/D converter circuit, and so on can be integrated into a CMOS image sensor chip, thereby enabling the product to be fabricated in a compact size. Accordingly, the CMOS image sensor is currently and extensively used in various applied technologies, such as digital still cameras and digital video cameras.

Meanwhile, in the CMOS image sensors, there are a 3T-type, a 4T-type, and a 5T-type according to the number of transistors, wherein the 3T-type CMOS image sensor is provided with one photodiode and three transistors, and the 4T-type CMOS image sensor is provided with one photo diode and four transistors. A layout of a unit pixel in the 4T-type CMOS image sensor will be described as follows.

FIG. 1 illustrates a diagram of an equivalent circuit for a related art 4T-type CMOS image sensor, and FIG. 2 illustrates a layout of a related art unit pixel of a 4T-type CMOS image sensor.

Referring to FIG. 1, the unit pixel 100 of the CMOS image sensor is provided with a photodiode 110 as a photoelectric conversion part, and four transistors. The four transistors are a transfer transistor 120, a reset transistor 130, a drive transistor 140, and a select transistor 150. Also, the unit pixel 100 at an output terminal OUT thereof has a load transistor 160 electrically connected thereto.

Of the unexplained reference symbols, FD denotes a floating diffusion region, Tx denotes a gate voltage of the transfer transistor 120, Rx denotes a gate voltage of the reset transistor 130, Dx denotes a gate voltage of the drive transistor 140, and Sx denotes a gate voltage of the select transistor 150.

As shown in FIG. 2, the unit pixel of the related art 4T-type CMOS image sensor has an active region 15 (a thick line) defined therein to form a device isolation film in a portion except the active region 15. Of the active region 15, a portion with a large width has one photodiode PD formed therein, and overlapped with rest of the active region 15, there are gate electrodes 123, 133, 143, 153 of the four transistors formed thereon. That is, the transfer transistor 120 is formed by the gate electrode 123, the reset transistor 130 is formed by the gate electrode 133, the drive transistor 140 is formed by the gate electrode 143, and the select transistor 150 is formed by the gate electrode 153. Herein, impurity ions are injected to the active region 15 of the respective transistors except portions under the gate electrodes 123, 133, 143, 153, thereby forming source/drain regions S/D of the respective transistors.

A method for fabricating a unit pixel of a related art CMOS image sensor will be described.

FIGS. 3A to 3C illustrate sections across a line I-I' in FIG. 2 showing the steps of a method for fabricating a related art CMOS image sensor.

Referring to FIG. 3A, a p-type epitaxial layer 102 is grown on a p-type semiconductor substrate 101, and a device isolation film 121 is formed in a portion excluding the active region of the p-type epitaxial layer 102 by an STI (Shallow Trench Isolation) process or the like.

An insulating film and a conductive layer are formed on an entire surface of the p-type epitaxial layer 102, and the insulating film and the conductive layer are removed selectively therefrom, to form a gate insulating film 122, and a gate electrode 123. Then, after a photoresist film is coated on entire surface of the substrate, a first photoresist film pattern 124 is formed for defining a lightly doped drain region for an LDD structure in a drain region on one side of the gate electrode 123 by photolithography process. In this instance, the first photoresist pattern does not expose the gate electrode 123.

In this state, impurity ions (for an example, n-type impurity ions) are injected into the active region of the substrate lightly, to form a lightly doped impurity region 115 in the substrate for the LDD structure.

Referring to FIG. 3B, the first photoresist film pattern 124 is removed, a second photoresist film pattern 125 is formed on the substrate to expose the photodiode region only, and impurity ions (for an example, n-type impurity ions) are injected lightly into the photodiode region, to form the photodiode 103.

Referring to FIG. 3C, the second photoresist film pattern 125 is removed, and an insulating film is deposited on entire surface thereof, and subjected to anisotropic etching, to form spacers 126 at sidewalls of the gate electrode 123.

A third photoresist film pattern (not shown) is formed on entire surface of the substrate so as to expose the photodiode region, and p-type impurity ions are injected by using the third photoresist film pattern and the spacers 126 as a mask, to form a p-type impurity region $p^0$ in a surface of the photodiode 103 region. The p-type impurity region $p^0$ serves to decrease a darkcurrent generated in the vicinity of a surface of the photodiode region.

Then, the third photoresist film pattern is removed, a fourth photoresist film pattern (not shown) is formed to expose the lightly doped impurity region 115 in the drain region on one side of the gate electrode 123, and n-type impurity ions are injected into the lightly doped impurity region 115 heavily by using the fourth photoresist film pattern and the spacers 126 as a mask, to form a heavily doped impurity region 127 in the drain region of the gate electrode 123.

However, the related art method for fabricating a CMOS image sensor has the following problems.

At the time of the n-type impurity injection into the p-type epitaxial layer for forming the photodiode region, of course, the impurities are injected into the active region, but, because the impurities are injected even to the device isolation film adjacent to the active region on which the photodiode is to be formed for some extent, there is current leakage from an interface of the active region and the device isolation film.

That is, the impurity ion injection into the interface of the active region and the device isolation film causes defects at the epitaxial layer of the interface, to produce charge or hole carriers, to provide places for reunion of the charges and the holes, thereby increasing the leakage current from the photodiode.

Consequently, a darkcurrent is generated, in which electrons migrate from the photodiode to the floating diffusion region in a state without light at all, starting from various defects and dangling bonds distributed mostly in surfaces of the photodiodes, interfaces of the device isolation film and the n-type regions of the photodiode, interfaces of the device isolation film and the p-type impurity region of the photodiode, interfaces of the p-type impurity region and the n-type impurity region of the photodiode, and the p-type impurity region and the n-type impurity region of the photodiode, and leads a low illumination characteristic of the CMOS image sensor poor.

In the meantime, U.S. Pat. No. 6,462,365, with a title "ACTIVE PIXEL HAVING REDUCED DARK CURRENT IN AL CMOS IMAGE SENSOR", discloses a method for suppressing increase of the darkcurrent caused by dangling bonds at a surface of the photodiode by forming a device isolation film and a transfer gate on a surface of the photodiode as a protection film.

However, this method also fails to disclose a method for suppressing increase of the darkcurrent by preventing the impurity ions from being injected into the interface of the device isolation film and the active region for the photodiode.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same, which can decrease a darkcurrent at a photodiode region and a device isolation region of an image sensor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a second conductive type semiconductor substrate having an active region and a device isolation region defined therein, wherein the active region has a photodiode region and a transistor region defined therein, a device isolating film in the semiconductor substrate of the device isolation region, a first conductive type impurity region in the semiconductor substrate of the photodiode region, the first conductive type impurity region being spaced a distance from the device isolation film, and a second conductive type first impurity region in the semiconductor substrate between the first conductive type impurity region and the device isolation film.

The second conductive type first impurity region has a depth the same with a depth of the first conductive type impurity region.

The second conductive type first impurity region has a depth the same with a depth of the device isolation film.

The CMOS image sensor further includes a second conductive type second impurity region at a surface of the first conductive type impurity region in the photodiode region.

The second conductive type first impurity region has a width the same with a depth of the second conductive type second impurity region.

The second conductive type first impurity region has an impurity concentration heavier than an impurity concentration of the second conductive type second impurity region.

The second conductive type first impurity region has an impurity concentration the same with an impurity concentration of the second conductive type second impurity region.

In another aspect of the present invention, a method for fabricating a CMOS image sensor, includes the steps of forming a device isolation film in a device isolation region of a second conductive type semiconductor substrate, for defining an active region having a photodiode region and a transistor region, forming a gate insulating film and a gate electrode on the semiconductor substrate of the transistor region, forming a lightly doped first conductive type impurity region in the semiconductor substrate of the photodiode region, forming a medium concentration second conductive type impurity region at a surface of the lightly doped first conductive type impurity region, and forming a heavily doped second conductive type impurity region in the substrate of the photodiode region adjacent to the device isolation film.

The heavily doped second conductive type impurity region has a width the same with a depth of the medium concentration second conductive type impurity region.

The heavily doped second conductive type impurity region has a depth the same with a depth of the device isolation film, or a depth of the lightly doped first conductive type impurity region.

In another aspect of the present invention, a method for fabricating a CMOS image sensor, includes the steps of forming a device isolation film in a device isolation region of a second conductive type semiconductor substrate, for defining an active region having a photodiode region and a transistor region, forming a gate insulating film and a gate electrode on the semiconductor substrate of the transistor region, forming a lightly doped first conductive type impurity region in the semiconductor substrate of the photodiode region, forming an insulating layer on an entire surface of the substrate inclusive of the gate electrode, selectively removing the insulating layer to expose the device isolating film and a predetermined portion of the photodiode region adjacent to the device isolating film, forming a phtoresist film pattern to expose the photodiode region on the insulating layer, and injecting second conductive type impurity ions at a medium concentration into the photodiode region by using the insulating layer and the photoresist pattern as a mask, to form medium concentration second conductive type impurity regions at an interface of the device isolating film and the photodiode region, and at a surface of the lightly doped first conductive type impurity region.

The medium concentration second conductive type impurity region at the interface of the device isolating film and the photodiode region has a depth deeper than a depth of the medium concentration second conductive type impurity region at the surface of the lightly doped first conductive type impurity region.

The medium concentration second conductive type impurity region at the interface of the device isolating film and the photodiode region has a depth the same with a depth of the device isolation film.

The medium concentration second conductive type impurity region at the interface of the device isolating film and the photodiode region has a width the same with a depth of the medium concentration second conductive type impurity region at the surface of the lightly doped first conductive type impurity region.

The insulating film exposes the photodiode region by a width in a range of 400~600 Å.

The insulating film is one of $SiH_4$ film, a USG (Undoped Silicate Glass) film deposited by chemical vapor deposition of high density plasma, a BPSG (Boro Phosphorous Silicate Glass) film, or TEOS (Tetra Ethyl Ortho Silicate) film.

The insulating film has a thickness smaller than a depth of the device isolation film by 300~500 Å.

The insulating film has a thickness of 2000~3000 Å.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 6A to 6F illustrate sections across a line II-II in FIG. 4 or 5 showing the steps of a method for fabricating a CMOS image sensor in accordance with a first preferred embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
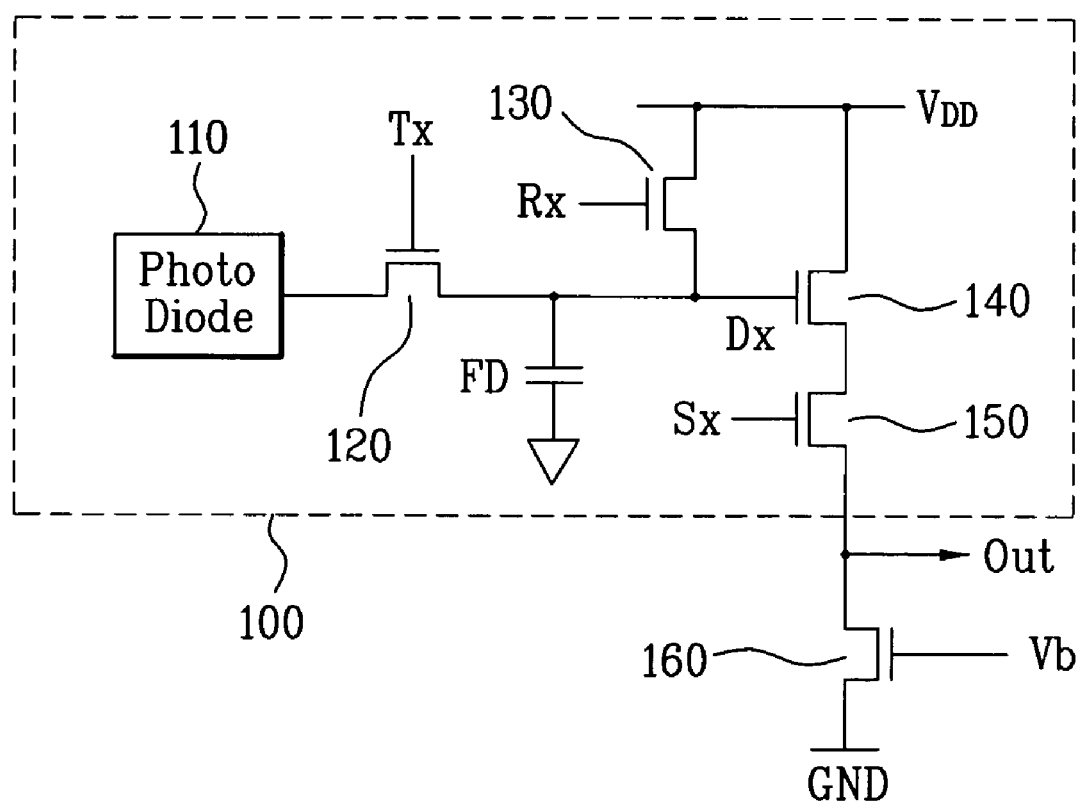
FIG. 1 illustrates a diagram of an equivalent circuit for a related art 4T-type CMOS image sensor.
Figure 2:
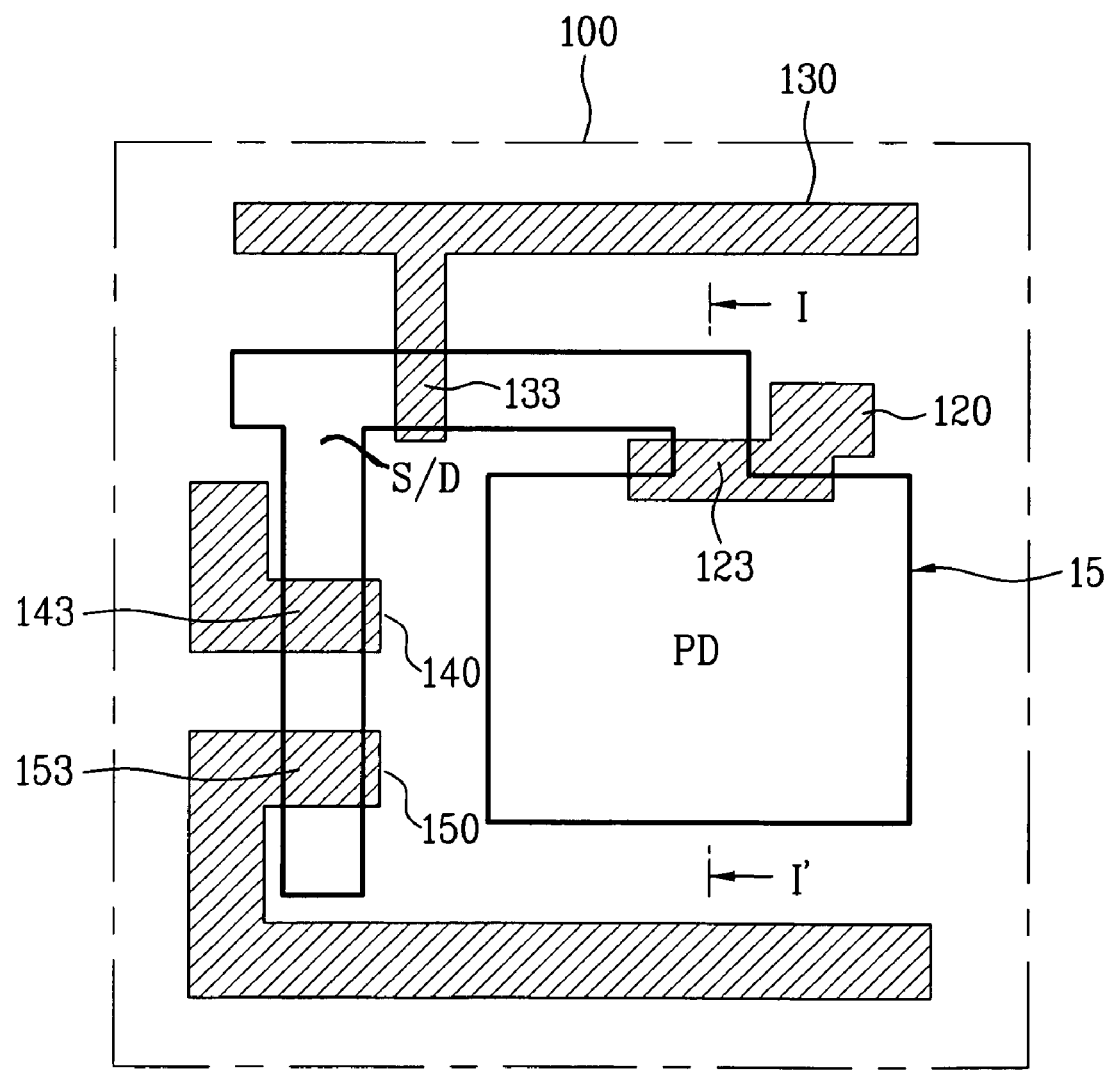
FIG. 2 illustrates a layout of a related art unit pixel of a 4T-type CMOS image sensor.
Figure 3A:
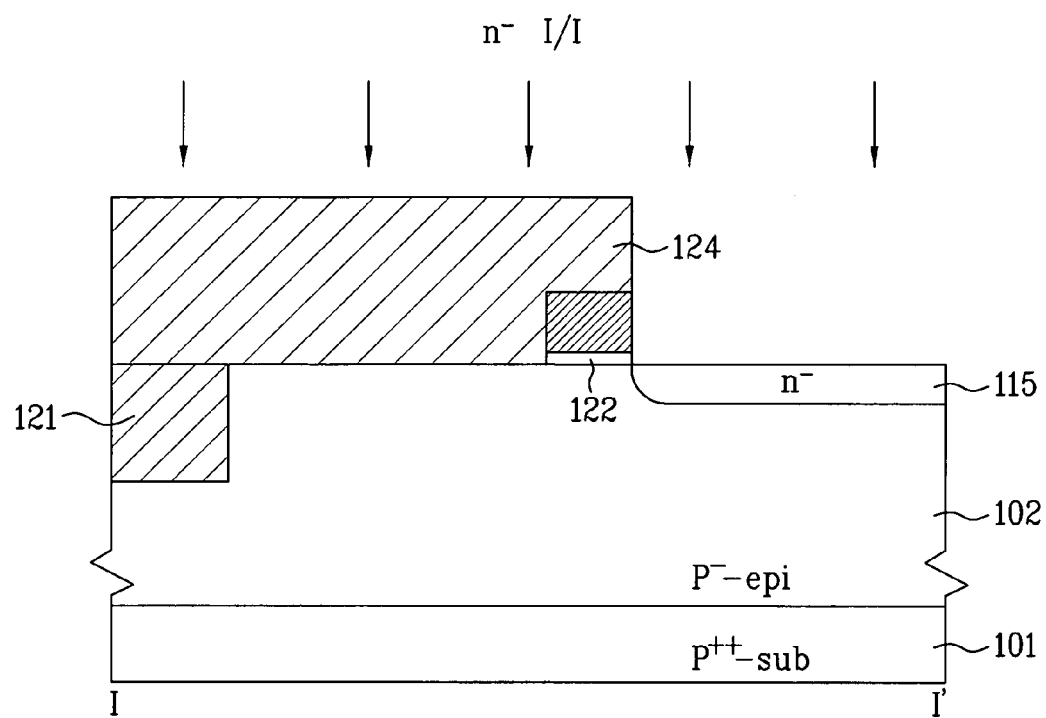
FIGS. 3A to 3C illustrate sections across a line I-I' in FIG. 2 showing the steps of a method for fabricating a related art CMOS image sensor.
Figure 3B:
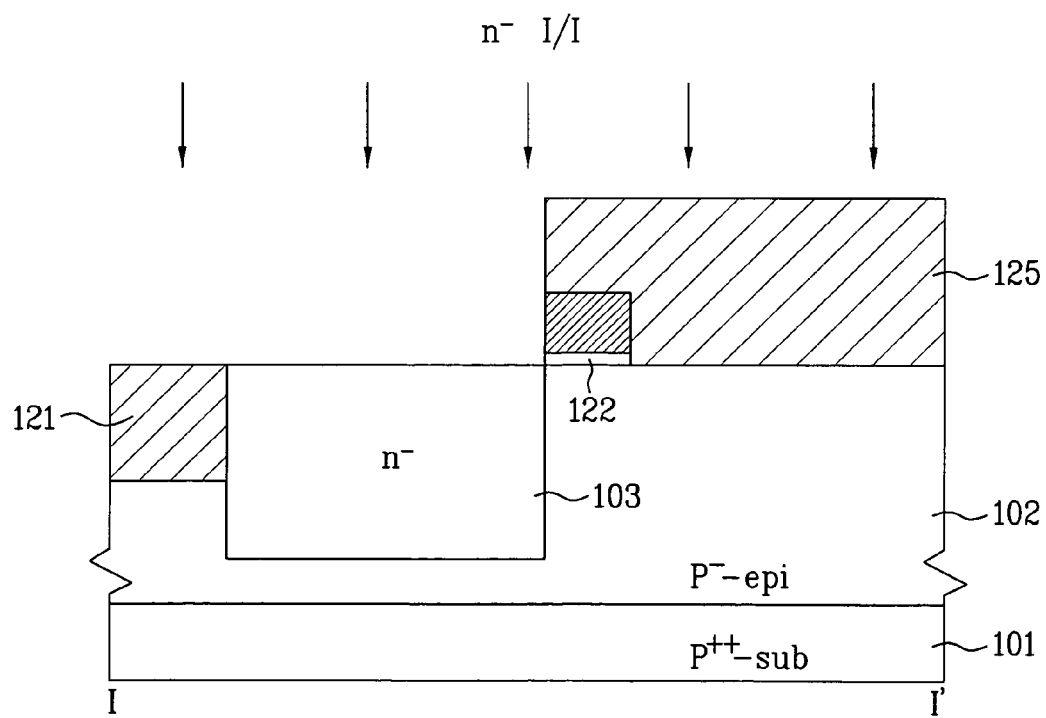
Figure 3C:
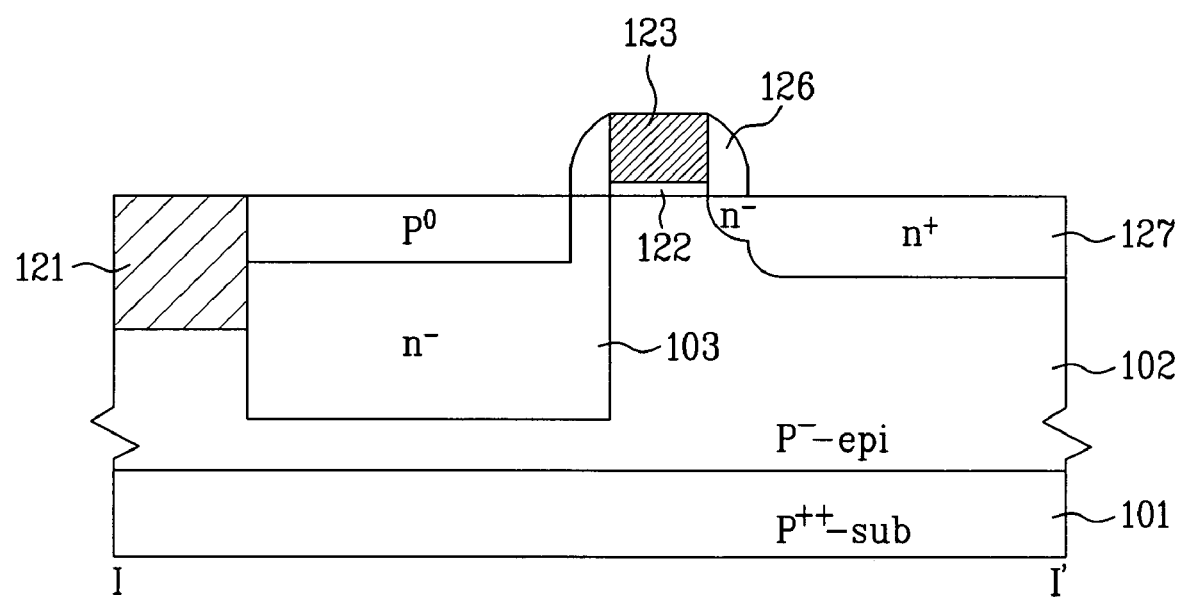
Figure 4:
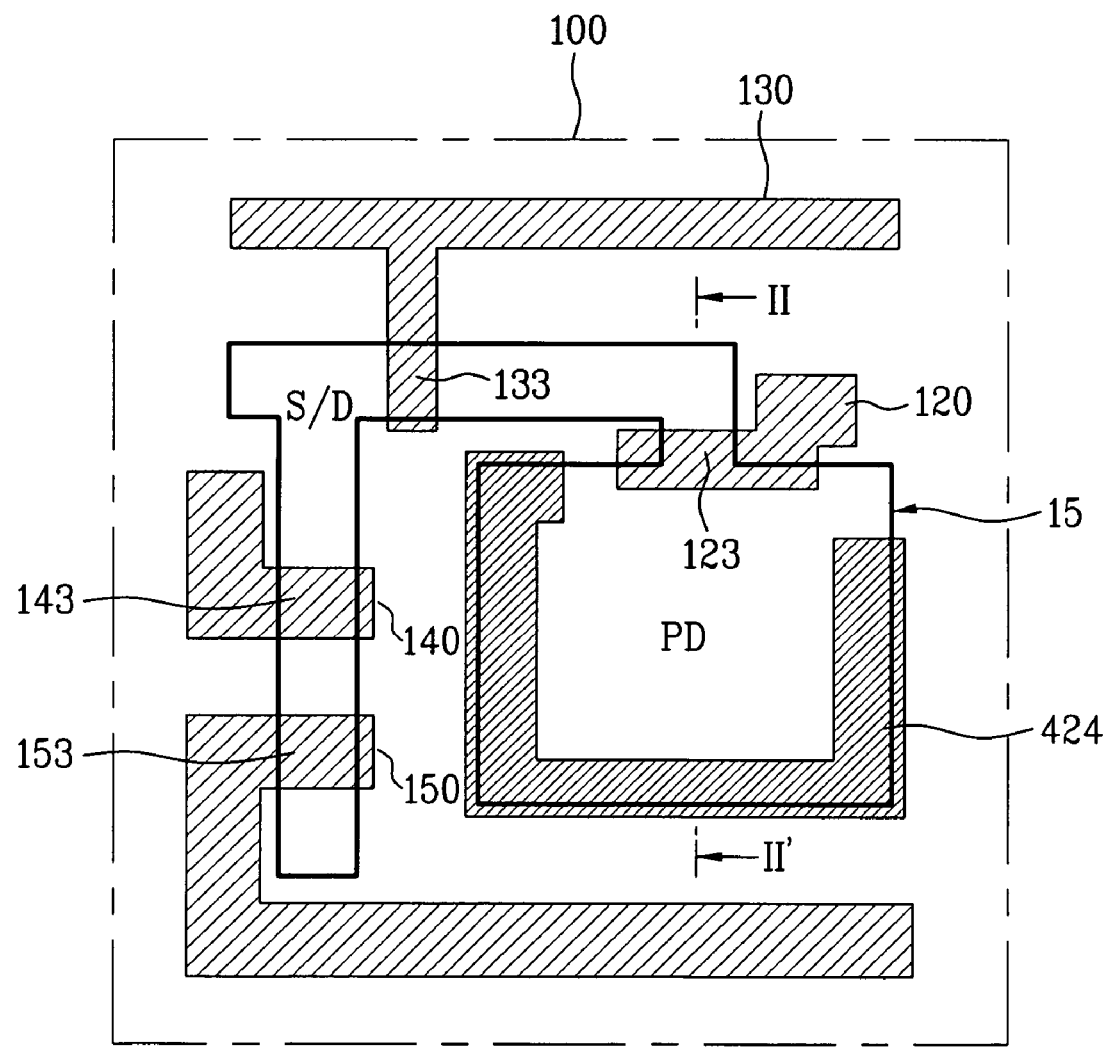
FIG. 4 illustrates a layout of a 4T-type CMOS image sensor in accordance with a first preferred embodiment of the present invention.
Figure 5:
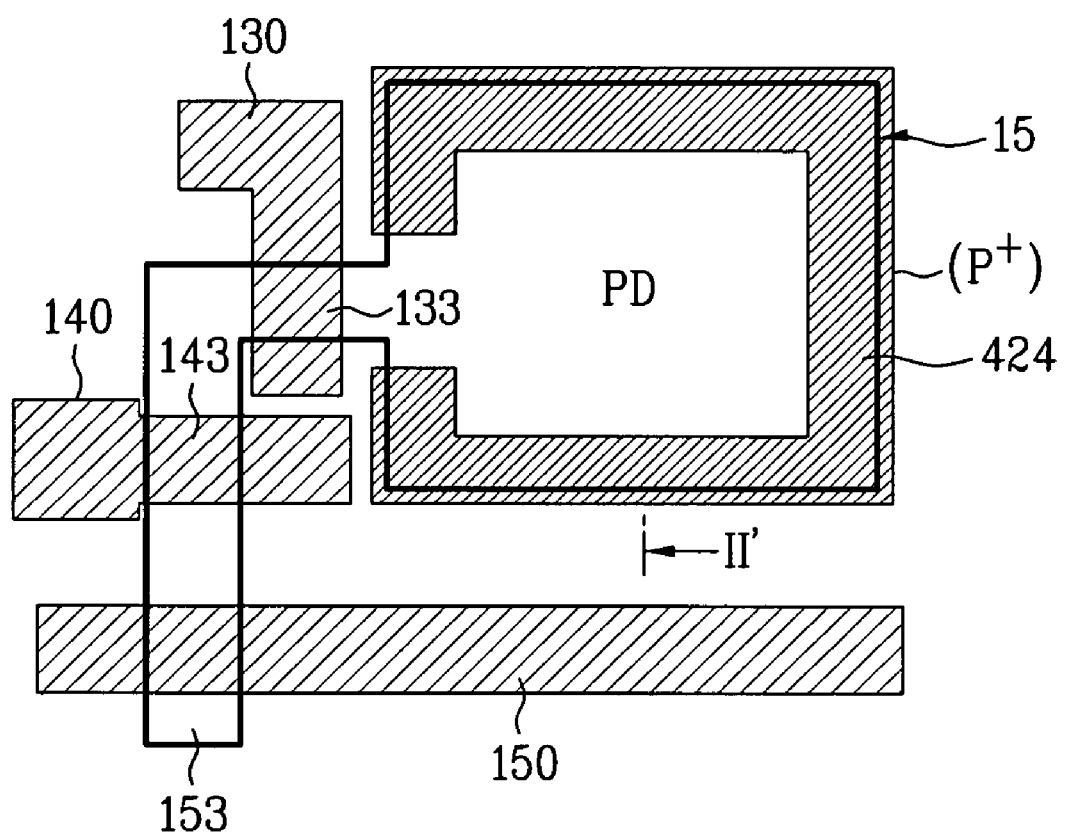
FIG. 5 illustrates a layout of a 3T-type CMOS image sensor in accordance with a second preferred embodiment of the present invention.

FIG. 4 illustrates a layout of a 4T-type CMOS image sensor in accordance with a first preferred embodiment of the present invention, and FIG. 5 illustrates a layout of a 3T-type CMOS image sensor in accordance with a second preferred embodiment of the present invention.

Referring to FIG. 4, a unit pixel 100 of a CMOS image sensor in accordance with a first preferred embodiment of the present invention has an active region (within a thick line) 15 defined on a substrate, and a device isolation film formed on a portion excluding the active region 15. Of the active region 15, a portion with a large width has one photodiode PD formed therein, and overlapped with rest of the active region 15, there are gate electrodes 123, 133, 143, 153 of the four transistors formed thereon. That is, the transfer transistor 120 is formed by the gate electrode 123, the reset transistor 130 is formed by the gate electrode 133, the drive transistor 140 is formed by the gate electrode 143, and the select transistor 150 is formed by the gate electrode 153.

Herein, impurity ions are injected into the active region 15 of the respective transistors except portions under the gate electrodes 123, 133, 143, and 153, thereby forming source/drain regions S/D of the respective transistors.

A heavily doped p-type impurity region 424 is formed at an interface of the photodiode PD and the device isolation film. The heavily doped p-type impurity region 424 serves to minimize generation of a darkcurrent. That is, as an impurity region with a conductive type (p-type) opposite to the photodiode region (n-type) is formed between the photodiode region and the device isolation film, generation of the darkcurrent at the interface between the photodiode and the device isolation film can be prevented in advance.

In the meantime, though it is shown that the unit pixel of the CMOS image sensor of the present invention has one photodiode and four transistors, the unit pixel may have one photodiode and three transistors, i.e., a reset transistor, a drive transistor, and a select transistor.

That is, referring to FIG. 5, a unit pixel 100 of a CMOS image sensor in accordance with a second preferred embodiment of the present invention has an active region (within a thick line) 15 defined on a substrate, and a device isolation film formed on a portion of the substrate excluding the active region 15. Of the active region 15, a portion with a large width has one photodiode PD formed therein, and overlapped with rest of the active region 15, there are gate electrodes 133, 143, and 153 of three transistors formed thereon. That is, the reset transistor 130 is formed by the gate electrode 133, the drive transistor 140 is formed by the gate electrode 143, and the select transistor 150 is formed by the gate electrode 153.

Herein, impurity ions are injected into the active region 15 of the respective transistors except portions under the gate electrodes 133, 143, and 153, thereby forming source/drain regions S/D of the respective transistors.

A heavily doped p-type impurity region 424 is formed at an interface of the photodiode PD and the device isolation film. The heavily doped p-type impurity region 424 serves to minimize generation of a darkcurrent. That is, as an impurity region with a conductive type (p-type) opposite to the photodiode region (n-type) is formed between the photodiode region and the device isolation film, generation of the darkcurrent at the interface between the photodiode and the device isolation film can be prevented in advance.

A method for fabricating a CMOS image sensor in accordance with the present invention will be described.

FIGS. 6A to 6F illustrate sections across a line II-II in FIG. 4 or 5 showing the steps of a method for fabricating a CMOS image sensor in accordance with a first preferred embodiment of the present invention.

Figure 6A:
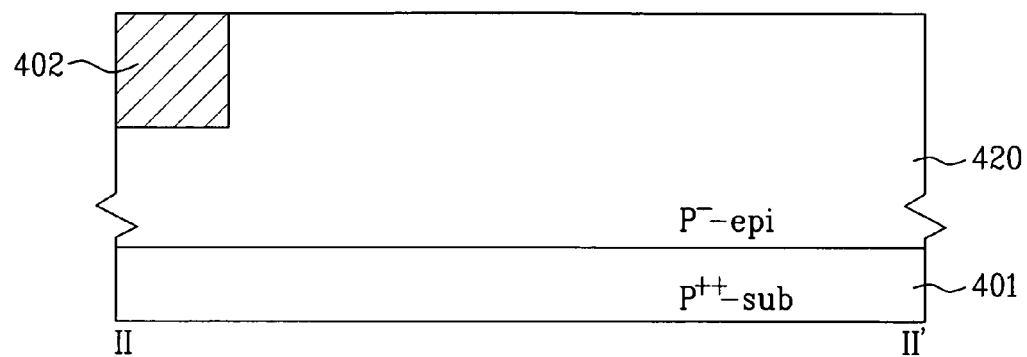

Referring to FIG. 6A, a p-type epitaxial layer 420 is grown on a semiconductor substrate (for an example, a p-type single crystal silicon substrate) 401, and a device isolation film 402 is formed on a portion excluding an active region of the p-type epitaxial layer 420 by STI (Shallow Trench Isolation) process or the like.

The device isolation film 402 may also be formed by a general isolation process other than the STI process, for an example, the LOCOS (Local Oxidation of Silicon) process. Since the p-type epitaxial layer 420 forms a large and deep depletion region in the photodiode, a capability of the low voltage photodiode for collecting photo charges is enhanced, to improve a photo-sensitivity of the photodiode.

Figure 6B:
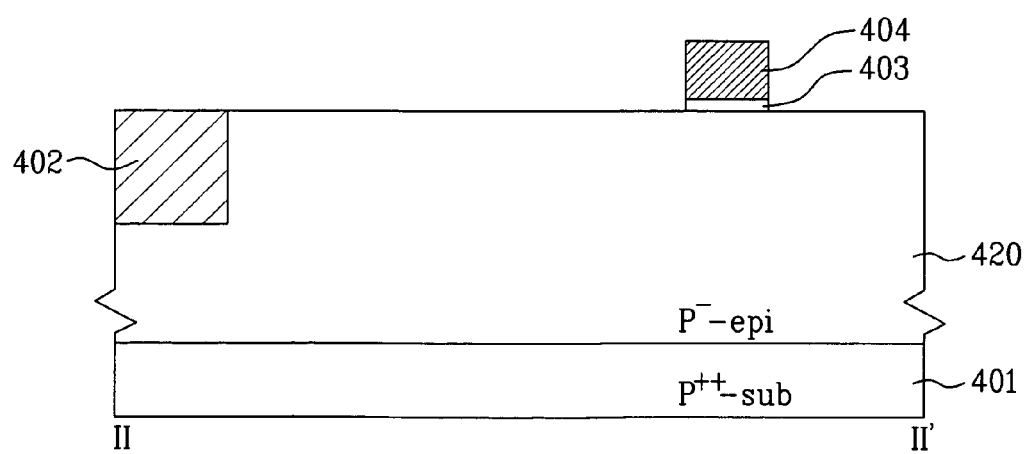

Referring to FIG. 6B, a gate insulating film, for an example, an oxide film is formed on the active region of the semiconductor substrate 401 to a thickness in a range of approximately 100 Å by thermal oxidation or low pressure chemical vapor deposition. Then, though not shown, in order to adjust a threshold voltage of a channel region to a desired value, ions are injected into the semiconductor substrate close to a surface thereof for adjusting the threshold voltage.

Then, a conductive layer is formed on the oxidation film by low pressure chemical vapor deposition for a gate electrode. The conductive layer may have a heavily doped polysilicon layer only, or a silicide layer may be formed on the heavily doped polysilicon layer. In this state, the conductive layer and the oxide film are patterned selectively by photolithography and etching, to form a gate electrode 404 and a gate insulating film 403. The gate electrode 404 corresponds to the gate electrode 123 of the transfer transistor in FIG. 4, or the gate electrode 133 of the reset transistor in FIG. 5.

Figure 6C:
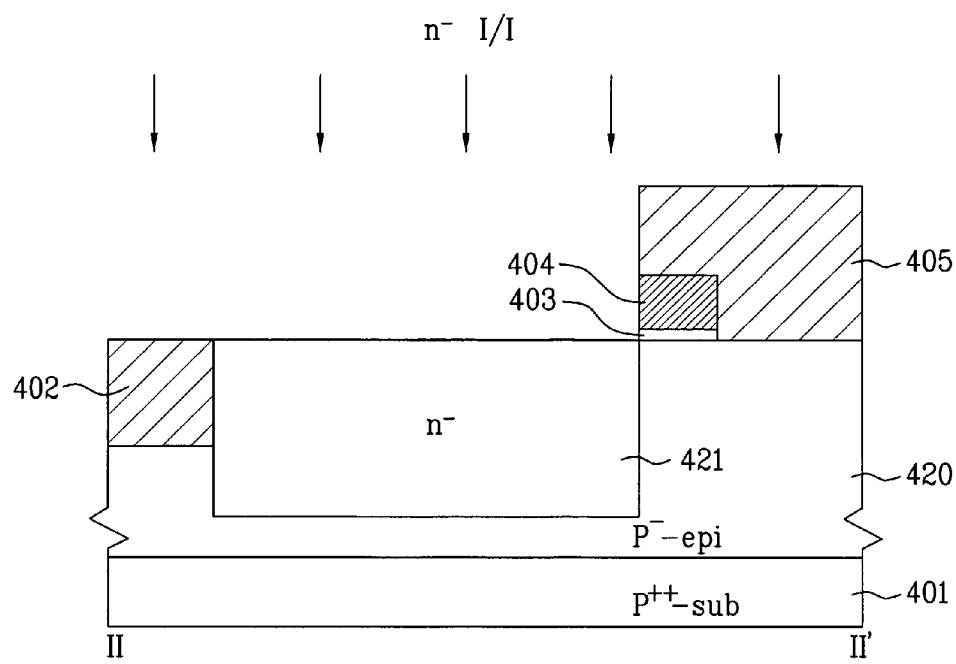

Referring to FIG. 6C, a photoresist film is coated on an entire surface of the substrate inclusive of the gate electrode 404, and subjected to patterning by exposure and development until the photodiode region is exposed, to form a first photoresist film pattern 405. Then, first conductive type ions (for an example, n-type impurity ions) are lightly injected into the photodiode region by using the first photoresist film pattern 405 as a mask, to form a lightly doped n-type impurity region 421, thereby forming a photodiode as a pn junction is formed with the p-type epitaxial layer 420.

The lightly doped n-type impurity region 421 has a depth greater than a height of the gate electrode 404. The lightly doped n-type impurity region 421 has a depth greater than a height of the gate electrode 404, for, as described before, enhancing sensitivity of the image senor.

Figure 6D:
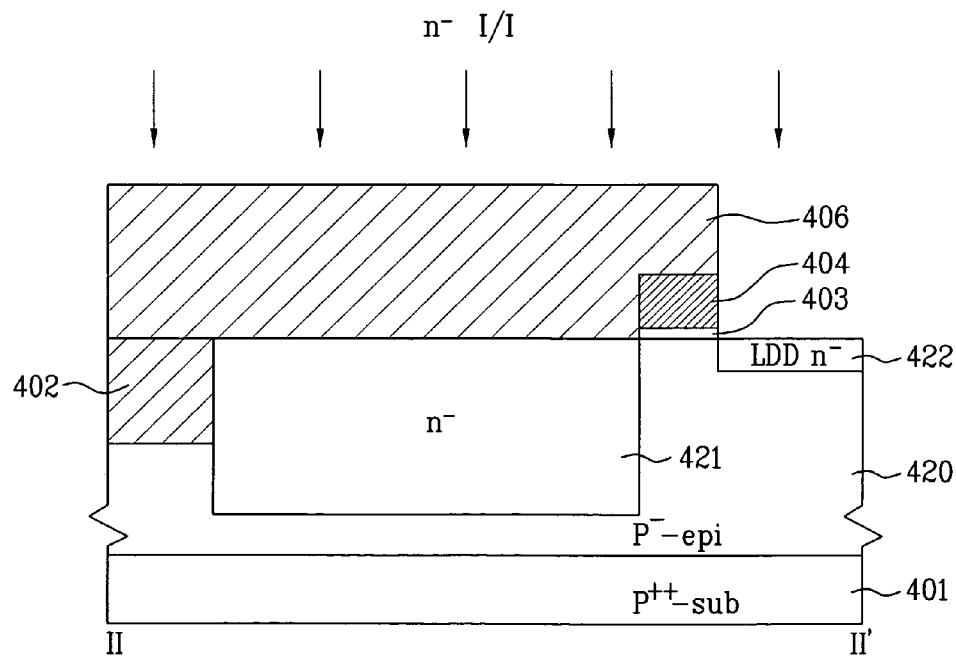

Referring to FIG. 6D, the first photoresist film pattern 405 is removed, and a photoresist film is deposited on the substrate, and patterned by exposure and development to form a second photoresist film pattern 406 to cover the photodiode region and expose a drain region on one side of the gate electrode 404. Then, first conductive type ions (for an example, n-type impurities) are injected into the active region lightly by using the second photoresist film pattern 406 as a mask. According to this, a lightly doped n-type impurity region 422 of an LDD (Lightly Doped Drain) structure is formed in the drain region on one side of the gate electrode 404.

Referring to FIG. 6E, the second photoresist film pattern 406 is removed, and an insulating film (for an example, a nitride film) is formed on an entire surface of the substrate inclusive of the gate electrode 404. The insulating film may have bi-layers of an oxide film and a nitride film, other than a single layered structure of the nitride film. Then, the insulating film both on the gate electrode 404 and the active region is etched by a dry etching process having an anisotropic characteristic, such as RIE (Reactive Ion Etching). According to this, spacers 407 are formed at sidewalls of the gate electrode 404.

A third photoresist film pattern 408 is formed on the substrate so as to leave the photodiode region exposed, and second conductive type ions (for an example, p-type impurities) are injected into a surface of the photodiode region at a medium concentration. According to this, a medium concentration second conductive type impurity region $p^0$ 423 is formed in the surface of the photodiode region defined by the device isolation film 402 and the spacers 407. Though spacers 407 are used as an ion injection mask for injecting medium concentration of second conductive type impurity ions, the third photoresist film pattern 408 may be formed to cover as much as widths of the substrate covered by the spacers, for using as the ion injection mask.

The medium concentration p-type impurity region 423 serves to reduce a darkcurrent generated at a surface of the substrate in the photodiode region. In more detail, at the time of injection of the n-type impurity ions lightly for forming the photodiode, defects occur at the surface of the substrate of the photodiode. The defects causes to form charge carriers which move to the floating diffusion region, to form a darkcurrent. According to this, the medium concentration p-type impurity region 423 captures the charge carriers, to prevent the darkcurrent from occurring in advance.

Referring to FIG. 6F, after removing the third photoresist film pattern 408, a photoresist film is formed on an entire surface of the substrate inclusive of the gate electrode 404, and subjected to exposure and development, to form a fourth photoresist film pattern 409 to expose a portion of the photodiode region adjacent to the device isolating film 402. In this instance, a width d2 of the photodiode region exposed by the fourth photoresist film pattern 409 is the same with a depth of the medium concentration p-type impurity region 423.

Then, second conductive type impurity ions (p-type impurities) are injected into the photodiode region adjacent to the device isolation film 402 by using the fourth photoresist film pattern 409 as a mask, heavily. According to this, a heavily doped p-type impurity region p⁺ 424 having a predetermined width is formed at an interface of the photodiode region and the device isolation film 402. Alike the medium concentration p-type impurity region 423 at the surface of the photodiode, the heavily doped p-type impurity region 424 serves to minimize generation of the darkcurrent.

The heavily doped p-type impurity region 424 has a depth d3 the same with a depth of the lightly doped n-type impurity region 421 of the photodiode, or a depth of the device isolation film 402. Further, the depth d3 of the heavily doped p-type impurity region 424 may be formed to be deeper than that of the depth of the lightly doped n-type impurity region 421 or the depth of the device isolation film 402 in order to improve a color characteristic of a particular color wavelength band.

Thereafter, though not shown, the fourth photoresist film pattern 409 is removed, and a unit process for fabricating a general CMOS image sensor, i.e., successive steps, such as injection of impurity ions heavily for forming source/drain, is performed, to complete fabrication of the CMOS image sensor of the present invention.

In the meantime, different from the first embodiment of the present invention, a heavily doped p-type impurity region may be formed at an interface of the device isolation film and the photodiode, for preventing the darkcurrent from generating.

FIGS. 7A to 7F illustrate sections across a line II-II in FIG. 4 or 5 showing the steps of a method for fabricating a CMOS image sensor in accordance with a second preferred embodiment of the present invention.

Figure 7A:
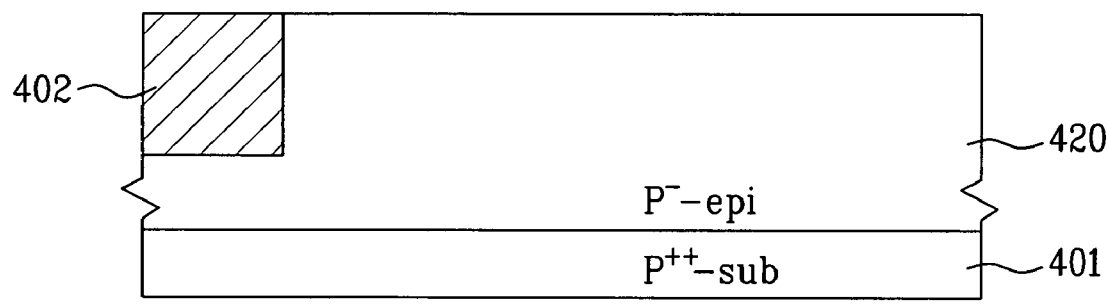
FIGS. 7A to 7F illustrate sections across a line II-II in FIG. 4 or 5 showing the steps of a method for fabricating a CMOS image sensor in accordance with a second preferred embodiment of the present invention.

Referring to FIG. 7A, a p-type epitaxial layer 420 is grown on a semiconductor substrate (for an example, a p-type single crystal silicon substrate) 401, and a device isolation film 402 is formed on a portion excluding an active region of the p-type epitaxial layer 420 by STI (Shallow Trench Isolation) process or the like.

The device isolation film 402 may also be formed by a general isolation process other than the STI process, for an example, the LOCOS (Local Oxidation of Silicon) process. Since the p-type epitaxial layer 420 forms a large and deep depletion region in the photodiode, a capability of the low voltage photodiode for collecting photo charges is enhanced, to improve a photo-sensitivity of the photodiode.

Figure 7B:
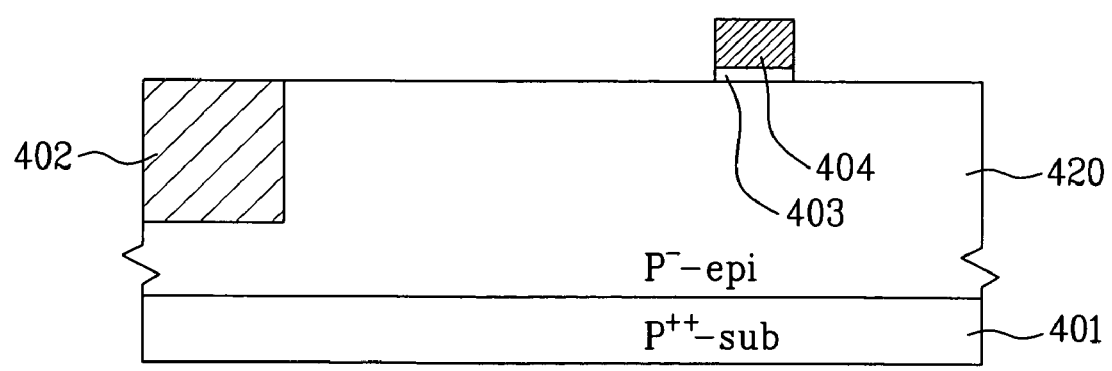

Referring to FIG. 7B, a gate insulating film, for an example, an oxide film is formed on the active region of the semiconductor substrate 401 to a thickness in a range of 100 Å by thermal oxidation or low pressure chemical vapor deposition. Then, though not shown, in order to adjust a threshold voltage of a channel region to a desired value, ions are injected into the semiconductor substrate close to a surface thereof for adjusting the threshold voltage.

Then, a conductive layer is formed on the oxidation film by low pressure chemical vapor deposition for a gate electrode. The conductive layer may have a heavily doped polysilicon layer only, or a silicide layer may be formed on the heavily doped polysilicon layer. In this state, the conductive layer and the oxide film are patterned selectively by photolithography and etching, to form a gate electrode 404 and a gate insulating film 403. The gate electrode 404 corresponds to the gate electrode 123 of the transfer transistor in FIG. 4, or the gate electrode 133 of the reset transistor in FIG. 5.

Figure 7C:
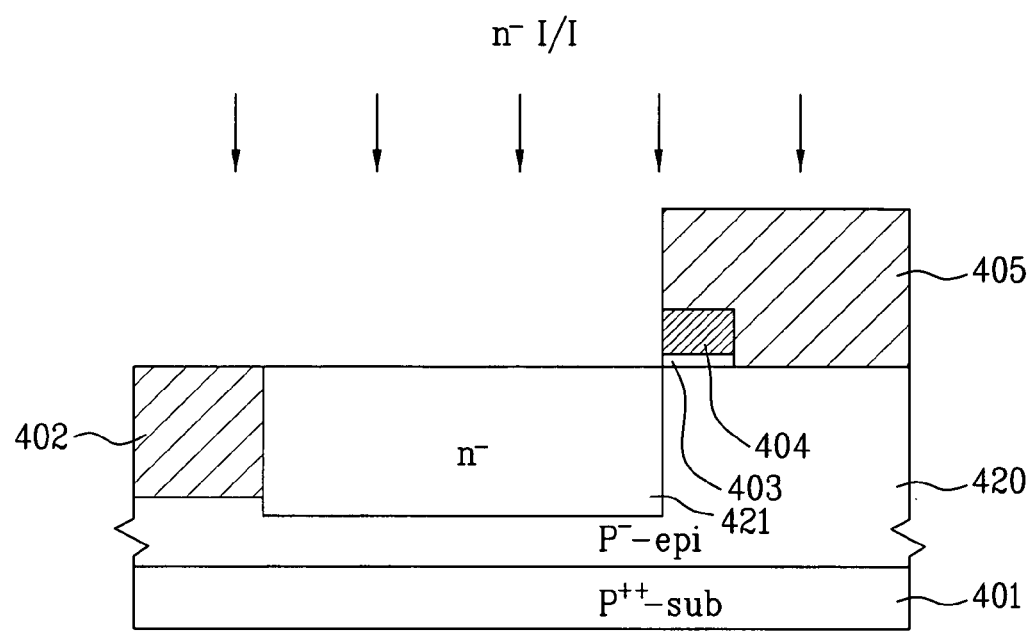

Referring to FIG. 7C, a photoresist film is coated on an entire surface of the substrate inclusive of the gate electrode 404, and subjected to patterning by exposure and development until the photodiode region is exposed, to form a first photoresist film pattern 405. Then, first conductive type ions (for an example, n-type impurity ions) are lightly injected into the photodiode region by using the first photoresist film pattern 405 as a mask, to form a lightly doped n-type impurity region 421, thereby forming a photodiode as a pn junction is formed with the p-type epitaxial layer 420.

The lightly doped n-type impurity region 421 has a depth greater than a height of the gate electrode 404. The lightly doped n-type impurity region 421 has a depth greater than a height of the gate electrode 404, for, as described before, enhancing sensitivity of the image senor.

Figure 7D:
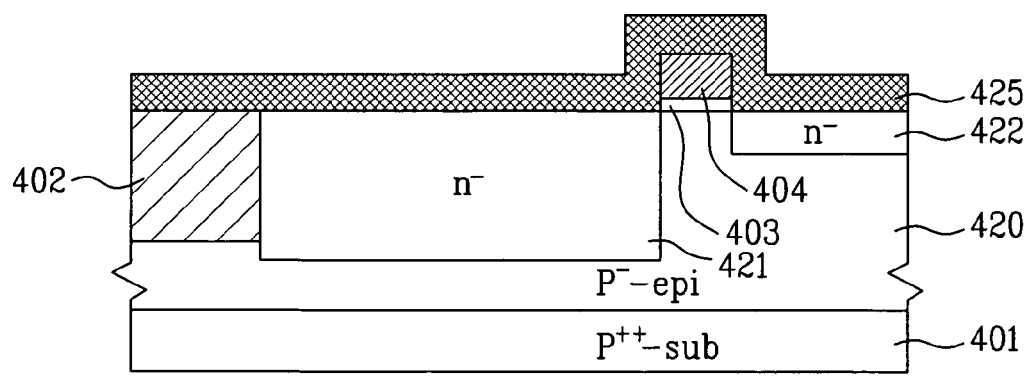

Referring to FIG. 7D, the first photoresist film pattern 405 is removed, and, though not shown, a photoresist film is deposited on the substrate, and patterned by exposure and development to form a second photoresist film pattern (see a reference numeral 406 in FIG. 6D) to cover the photodiode region and expose a drain region on one side of the gate electrode 404. Then, first conductive type ions (for an example, n-type impurities) are injected into the active region lightly by using the second photoresist film pattern 406 as a mask. According to this, a lightly doped n-type impurity region 422 of an LDD (Lightly Doped Drain) structure is formed in the drain region on one side of the gate electrode 404.

Then, the second photoresist film pattern is removed, and an insulating film 425 is formed on an entire surface of the substrate inclusive of the gate electrode 404. It is required that the insulating film 425 is formed of a material which allows penetration of a predetermined amount of ions in a following step. Therefore, the insulating film 425 may be an SiH₄ film, a USG (Undoped Silicate Glass) film deposited by chemical vapor deposition of high density plasma, a BPSG (Boro Phosphorous Silicate Glass) film, or TEOS (Tetra Ethyl Ortho Silicate) film, and so on. It is preferable that the insulating film 425 has a thickness smaller than a height of the device isolation film 402 by a range of 300~500 Å, for an example, 2000~3000 Å.

Figure 7E:
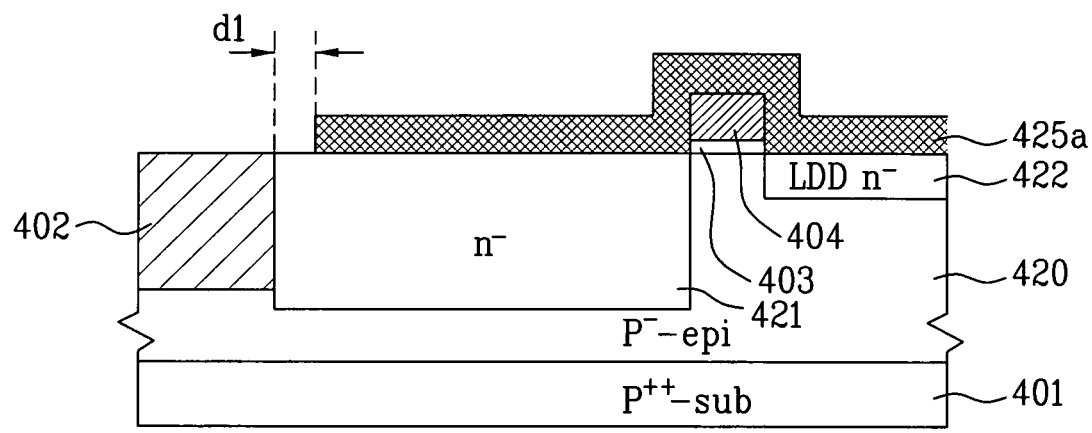

Referring to FIG. 7E, the insulating film 425 is patterned by photolithography and etching to expose the photodiode region adjacent to the device isolation film 402. In this instance, a width d1 of the photodiode region exposed by a patterned insulating layer 425a is in a range of 400~600 Å.

Figure 7F:
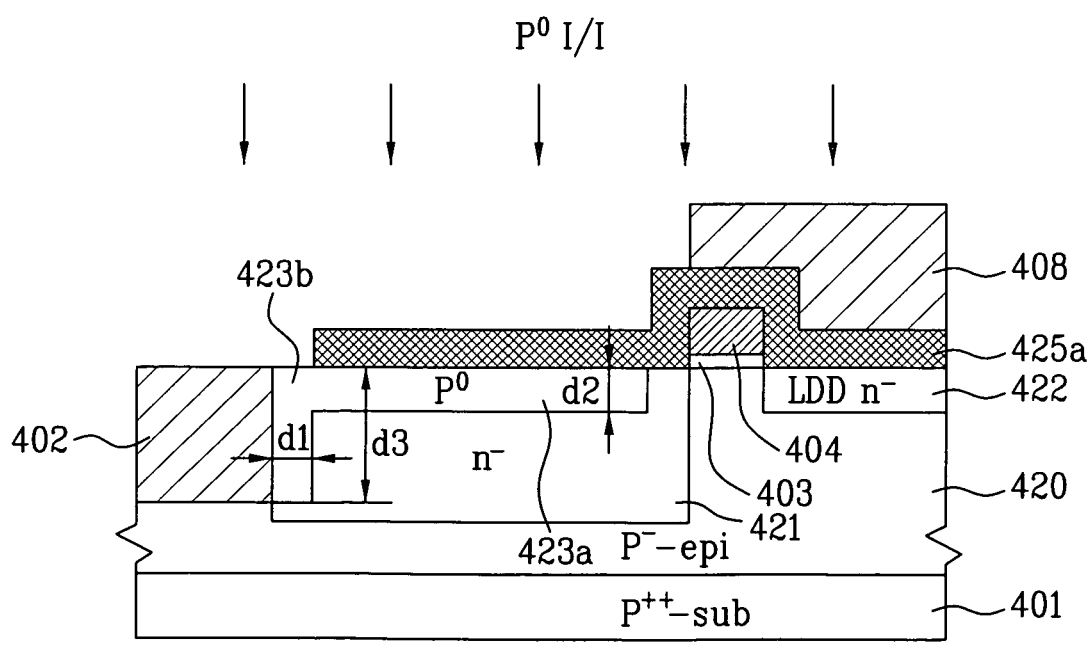

Referring to FIG. 7F, after a photoresist film is coated on an entire surface of the substrate inclusive of the patterned insulating film 425a, the photoresist film is removed from the photodiode region selectively, to form a third photoresist film pattern 408.

Then, second conductive type impurity ions (for an example, p-type impurities) are injected into the photodiode region. BF₂ ions are used as the p-type impurity ions, and injected at a concentration of 10E12~13 ions/cm³.

According to this, medium concentration p-type impurity ions p° 423a, and 423b are formed both at a surface of a portion of the photodiode region exposed by the insulating film 425a, and at a surface of a portion of the photodiode region exposed by the third photoresist film pattern 408.

In this instance, the medium concentration p-type impurity region 423b in the photodiode region exposed by the insulating film 425a has a depth d3 the same with a depth of the device isolation film 402, and, since the medium concentration p-type impurity region 423a at the surface of the photodiode region has the insulating film 425a formed thereon, the medium concentration p-type impurity region 423a has a depth d2 smaller than the region exposed by the insulating film 425a, preferably the same with a width d1 (i.e., 400~600 Å) of the photodiode region exposed by the insulating layer 425a.

The medium concentration p-type impurity regions 423a, and 423b serve to reduce the darkcurrents generated at the surface of the substrate in the photodiode region and at the interface of the photodiode region and the device isolation film 402, respectively.

In the meantime, in formation of the medium concentration p-type impurity regions 423a, and 423b, because the present invention utilizes the insulating film 425a and the third photoresist film pattern 408 formed on the insulating film 425a as an ion injection mask, enabling to dispense with a spacer formation step of the related art in which the spacers are formed at sidewalls of the gate electrode 404, and the spacers are used as an ion injection mask, the present invention can simplify a fabrication process.

Moreover, the insulating film 425a at the sidewalls of the gate electrode 404 formed substantially thicker than a thickness of the photodiode region, to impede penetration of the ions through the insulating film 425a in the vicinity of the gate electrode 404, and subsequent formation of the medium concentration p-type impurity region 423a therein at the time of ion injection, a self-align effect can be obtained.

Thereafter, though not shown, upon application of a unit process for fabricating a general CMOS image sensor, i.e., successive steps, such as injection of impurity ions heavily for forming source/drain, is performed, after removing the insulating film 425a, fabrication of the CMOS image sensor of the present invention is completed.

Though embodiments of the present invention are described with reference to sections across the line II-II' in FIG. 4 or 5, the description is applicable to all regions in contact with the photodiode region and the device isolation film 402.

In addition to this, even though the embodiments of the present invention are described centered on cases of p-type substrates, the descriptions are applicable to cases of opposite conductive type, i.e., n-type substrates, too.

As has been described, the CMOS image sensor and the method for fabricating the same of the present invention have the following advantage.

The region of a conductive type $p^o$ opposite to the conductive type $n^-$ of the photodiode region at an interface of the photodiode region and the device isolation film enables to prevent the darkcurrent from occurring, which is induced by defects at the time of formation of the $n^-$ region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a CMOS image sensor, comprising the steps of:
   forming a device isolation film in a second conductive type semiconductor substrate, defining an active region having a photodiode region and a transistor region;
   forming a gate insulating film and a gate electrode on the transistor region of the semiconductor substrate;
   forming a lightly doped first conductive type impurity region in the photodiode region of the semiconductor substrate;
   forming a medium concentration second conductive type impurity region at a surface of the lightly doped first conductive type impurity region; and
   forming a heavily doped second conductive type impurity region adjacent to the device isolation film in the photodiode region of the substrate, the heavily doped second conductive type impurity region having a depth the same as a depth of the device isolation film, or a depth of the lightly doped first conductive type impurity region.

2. The method as claimed in claim 1, wherein the heavily doped second conductive type impurity region has a predetermined width.

3. A method for fabricating a CMOS image sensor, comprising the steps of:
   forming a device isolation film in a second conductive type semiconductor substrate, defining an active region having a photodiode region and a transistor region;
   forming a gate insulating film and a gate electrode on the transistor region of the semiconductor substrate;
   forming a lightly doped first conductive type impurity region in the photodiode region of the semiconductor substrate;
   forming a medium concentration second conductive type impurity region at a surface of the lightly doped first conductive type impurity region; and
   forming a heavily doped second conductive type impurity region adjacent to the device isolation film in the photodiode region of the substrate, the heavily doped second conductive type impurity region having a width the same as a depth of the medium concentration second conductive type impurity region.

4. The method as claimed in claim 3, wherein the heavily doped second conductive type impurity region has a dept the same as a depth of the device isolation film, or a depth of the lightly doped first conductive type impurity region.

5. The method as claimed in claim 3, further comprising forming an insulating layer on an entire surface of the substrate inclusive of the gate electrode.

6. The method as claimed in claim 5, wherein forming the insulating layer is performed after forming the lightly doped first conductive type impurity region and before forming the medium concentration second conductive type impurity region.

7. The method as claimed in claim 5, further comprising anisotropically etching the insulating layer to form spacers at sidewalls of the gate electrode.

8. The method as claimed in claim 7, wherein the steps of forming the insulating layer and anisotropically etching the insulating layer are performed after forming the lightly doped first conductive type impurity region and before forming the medium concentration second conductive type impurity region.

9. The method as claimed in claim 3, wherein the semiconductor substrate comprises an epitaxial layer on a heavily doped second conductive type substrate.

10. The method as claimed in claim 3, further comprising forming a photoresist film pattern on the substrate so as to expose the photodiode region adjacent to the device isolation film.

11. The method as claimed in claim 10, wherein the exposed photodiode region has a predetermined width.

12. A method for fabricating a CMOS image sensor, comprising the steps of:
   forming a device isolation film in a second conductive type semiconductor substrate, defining an active region having a photodiode region and a transistor region;

forming a gate insulating film and a gate electrode on the transistor region of the semiconductor substrate;

forming a lightly doped first conductive type impurity region in the photodiode region of the semiconductor substrate;

forming an insulating layer on an entire surface of the substrate inclusive of the gate electrode;

selectively removing the insulating layer to expose the device isolating film and a predetermined portion of the photodiode region adjacent to the device isolating film, forming a photoresist film pattern to expose the photodiode region and the insulating layer; and injecting second conductive type impurity ions at a medium concentration into the photodiode region using the insulating layer and the photoresist pattern as a mask, to form medium concentration second conductive type impurity regions at an interface of the device isolating film and the photodiode region and at a surface of the lightly doped first conductive type impurity region, the medium concentration second conductive type impurity region at the interface of the device isolating film and the photodiode region having a depth deeper than a depth of the medium concentration second conductive type impurity region at the surface of the hightly doped first conductive type impurity region.

13. The method as claimed in claim 12, wherein the medium concentration second conductive type impurity region at the interface of the device isolating film and the photodiode region has a depth the same with a depth of the device isolation film.

14. The method as claimed in claim 12, wherein the medium concentration second conductive type impurity region at the interface of the device isolating film and the photodiode region has a width the same with a depth of the medium concentration second conductive type impurity region at the surface of the lightly doped first conductive type impurity region.

15. The method as claimed in claim 12, wherein the insulating film exposes the photodiode region by a width in a range of 400~600 Å.

16. The method as claimed in claim 12, wherein the insulating layer comprises one of an insulating film formed from $SiH_4$, a USG (Undoped Silicate Glass) film, a BPSG (Boro Phosphorous Silicate Glass) film, or a TEOS (tetra Ethyl Ortho Silicate) film.

17. The method of claim 16, wherein the insulating film comprises said USG film, and forming the insulating layer comprises depositing said USG film by high density plasma chemical vapor deposition.

18. The method as claimed in claim 12, wherein the insulating film has a thickness smaller than a depth of the device isolation film by 300~500Å.

19. The method as claimed in claim 12, wherein the insulating film has a thickness of 2000~3000 Å.

20. The method as claimed in claim 12, wherein the semiconductor substrate comprises an epitaxial layer on a heavily doped second conductive type substrate.

* * * * *